United States Patent [19]
Zukotynski et al.
[11] 4,359,367
[45] Nov. 16, 1982

[54] SILICON-BASED SEMICONDUCTOR DEVICES

[75] Inventors: Stefan Zukotynski, Thornhill; Ki B. Ma, Toronto; John Perz, Agincourt; Andrzej Szadkowski; Ben-Gur Yacobi, both of Toronto, all of Canada

[73] Assignee: Governing Council of the University of Toronto, Toronto, Canada

[21] Appl. No.: 162,846

[22] Filed: Jun. 25, 1980

[51] Int. Cl.3 .......................... C25D 7/12; C25D 5/50
[52] U.S. Cl. .............................. 204/37 R; 204/38 R; 204/129; 204/130; 136/258; 427/70; 427/84
[58] Field of Search .................... 204/37 R, 129, 130, 204/38 R; 357/4; 136/258 AM; 427/70, 84

[56] References Cited

U.S. PATENT DOCUMENTS 4,265,720 5/1981 Winstel .............................. 204/129

OTHER PUBLICATIONS

"Cathodic Deposition of Amorphous Si from Solutions of Silicic Acid and Tetraethyl Ortho-Silicate in Ethylene Glycol & Fermamide Containing HF", Mohan et al., Electrochem. Acta., vol. 27, #3, pp. 371-377, 1982.
"Hydrogenated Amorphous Si Films in Pd Schottky Barrier Cells", Carlson et al., *Solar Cells,* 1 (1979/80), 371-379.

*Primary Examiner*—R. L. Andrews
*Attorney, Agent, or Firm*—Hirons, Rogers & Scott

[57] ABSTRACT

A new silicon based semiconductor device comprises a layer of amorphous silicon in which the density of energy states in the energy gap has been reduced by hydrogenation; this layer is deposited on a layer of a hydrogen-containing substrate material that can supply hydrogen in atomic form to the amorphous silicon. In processes of the invention the silicon layer and a substrate layer are hydrogenated separately to permit optimum hydrogenation; the silicon layer may be deposited without hydrogenation and hydrogenated subsequently with hydrogen from the substrate material. A specific example consists of a layer of hydrogenated amorphous silicon of about 1 micrometer thickness deposited on a hydrogen-containing chromium layer which is itself deposited on a carrier, the silicon then forming the active element of a photovoltaic cell particularly functional as a solar cell.

12 Claims, No Drawings

SILICON-BASED SEMICONDUCTOR DEVICES

FIELD OF THE INVENTION

This invention relates to silicon-based semiconductor devices, and more particularly but not exclusively to such devices for use in solar cells, and to processes for the preparation of such devices.

REVIEW OF THE PRIOR ART

Most silicon solar cells known at the present time use crystalline silicon which has been doped by the addition of impurities in controlled amounts. Recent developments have indicated that amorphous silicon can also be used in semiconductor devices, particularly in solar cells. It has two major advantages over crystalline silicon; firstly, it is cheaper to prepare; secondly, it has a large optical absorption co-efficient in the part of solar spectrum which is most important for efficient solar cell operation, making it possible to use very thin films, e.g. of the order of one micrometer.

Amorphous silicon by itself has so large a density of states in the energy gap that it cannot be used in practical photovoltaic devices. First it cannot be doped to produce a satisfactory p-n junction. Second a satisfactory Schnottky barrier cannot be produced. In addition, it has an extremely low carrier life-time. It has been noted that these problems can be significantly alleviated, by introducing hydrogen into amorphous silicon, which has the effect of significantly decreasing the density of states in the gap to the extent that the electronic properties of the silicon semi-conductor can be controlled.

The high density of localised states in the gap found in amorphous silicon is a consequence of the large number of unsaturated bonds in the material, and the beneficial effect of introducing hydrogen is understood to arise from the saturation of these bonds. For convenience in nomenclature the term "hydrogenation" is applied to the process of adding hydrogen to the silicon material and to the substrate matter, but is not intended to imply that any specific physical or chemical interaction is to take place.

U.S. Pat. No. 4,064,521 of Carlson discloses a method of producing solar cells using amorphous silicon as the semiconducting material. The amorphous silicon is deposited from silane gas ($SiH_4$) at a pressure of about $10^{-3}$ Torr, by submitting it to glow discharge, the deposition taking place on to a metal such as antimony held at a temperature in a range of 105° C.–450° C.

The silane decomposition technique described by Carlson results in the formation of a silicon-hydrogen alloy which may contain from about 1 to about 50 atomic percent hydrogen, depending on deposition parameters, these hydrogen atoms entering into a variety of configurations. The silicon-hydrogen alloy has a lower density of states in the gap than evaporated amorphous silicon. However, some of these configurations give rise to undesirable states. The probability of creating these unwanted configurations can be lowered by post-hydrogenation of amorphous silicon. It has in fact been shown that the properties of evaporated amorphous silicon posthydrogenated by heating in hydrogen plasma are improved.

DEFINITION OF THE INVENTION

It is an object therefore of the present invention to provide new semiconductor devices based on amorphous silicon, and new processes for producing such devices.

It is a more specific object to provide such new devices that are particularly suited to function as solar photovoltaic cells.

In accordance with the present invention there is provided an amorphous-silicon-based semiconductor device comprising:

a thicker layer of hydrogen-containing substrate material from which hydrogen can be released by heating thereof, and a thinner layer of hydrogenated amorphous silicon deposited on the said hydrogen-containing substrate material so as to receive hydrogen released therefrom.

Also in accordance with the invention there is provided a method of making an amorphous-silicon-based semi-conductor device including the steps of:

(a) preparing a thicker hydrogen-containing substrate layer of a material, (b) depositing a thinner layer of amorphous silicon on the hydrogen-containing layer so that the silicon layer can receive hydrogen released therefrom, and (c) hydrogenating the said thinner layer of amorphous silicon.

Silicon layer is hydrogenated with hydrogen obtained from the hydrogen-carrying substrate layer.

Hydrogen may be released from the hydrogen-containing layer for hydrogenation of the silicon by heating to a temperature between about 200° and 450° C.

The hydrogen-containing substrate material may be a metal that is hydrogenated by electro-chemical processes. The silicon may be hydrogenated by electrolysis.

Preferably the initial hydrogen content of the silicon is in the range from about 1 to about 20 atomic percent, while the initial hydrogen content of the hydrogen-containing material may be in the range from about 1 to 50 atomic percent.

Preferably there is provided on the surfaces of the hydrogen-containing substrate material not covered by silicon a barrier material relatively impervious to hydrogen to inhibit escape of hydrogen from the hydrogen-containing substrate material except into the silicon layer.

The substrate may be a layer of a selected metal of thickness in the range 1 to 100 μm mounted on a further layer of a support material. Preferably, the thickness of the silicon layer is between 0.2 and 1.5 μm.

The method may include the further step of reloading the hydrogen-containing substrate material with hydrogen.

Thus, in devices of the present invention the amorphous silicon is associated with a hydrogen-containing metal carrier, which can act as a supplier of hydrogen for the initial hydrogenation of the amorphous silicon and/or for the maintenance of the hydrogenation thereof. In one process of the invention hydrogen is introduced into the metallic carrier material, subsequently, the hydrogen-containing material is activated to transfer at least some of its absorbed atomic hydrogen to the amorphous silicon up to a desired concentration. The transfer may take place at the time of the initial fabrication or at a later time, the activation being effected by heating of at least the hydrogen-containing material, so that effectively the carrier material acts as a reservoir of hydrogen for later supply to the silicon when required.

The performance of a solar cell based upon amorphous silicon is known to deteriorate with time, one of the main reasons being the release of hydrogen from the amorphous silicon. The present invention therefore provides a means for overcoming this degradation problem, by providing a reservoir of readily available hydrogen in the device to be supplied to the amorphous silicon semiconductor as and when required. In effect, therefore, the solar cell can be "regenerated", by transfer of the hydrogen from the carrier material to the amorphous silicon, by heating to the prescribed temperature.

Post hydrogenation normally requires the use of atomic hydrogen, since processes with molecular hydrogen are too slow. Atomic hydrogen is immediately and simply available when transferred from a hydrogen-containing metal suitably associated with the silicon layer.

In another process according to the present invention, the amorphous silicon, optionally secured to, in contact with, or otherwise closely associated with a suitable substrate metal, which may itself be mounted on a carrier such as another metal, is made the electrode of an electrolysis cell, in which hydrogen is generated on passage of electric current through an electrolyte. A portion of the hydrogen is absorbed by the silicon to cause hydrogenation thereof. A further portion of the hydrogen possibly greater than that absorbed by the silicon, is absorbed by the substrate metal, and is available for further hydrogenation of the amorphous silicon at a later time.

The hydrogen-containing substrate material with which the amorphous silicon is associated should be one which is capable of absorbing sustantial amounts of hydrogen; and further capable of releasing at least a portion of such hydrogen in atomic state upon heating to a temperature in the range 200° C. to 600° C., preferably to 450° C. It is undesirable to have to heat the substrate and associated amorphous silicon to temperatures above about 450° C., since the silicon may crystallize. On the other hand one does not want to release the atomic hydrogen from the metal at temperatures below about 200° C., since a cell is quite likely to encounter such temperatures during operation. The proportion of hydrogen to be incorporated will depend, among other parameters, on the thickness of the metal; thus a thick metal substrate will be effective with a low concentration since it will still contain a considerable quantity of hydrogen while a thin substrate will require a higher concentration.

Suitable metals are transition metals having incomplete electronic d-shells and alloys having a major portion of one or more of these metals. Examples of preferred metals for use as the hydrogen carrier in the present invention include those selected from the group consisting of titanium, vanadium, chromium, manganese, iron, cobalt and nickel, and alloys having a major proportion of one or more of these metals. The particularly preferred metal is chromium. Preferred alloys contain chromium, iron and nickel.

The amorphous silicon needs to be closely associated with the excess hydrogen-containing carrier metal, so that transfer of the hydrogen from the metal to the amorphous silicon is readily accomplished when required. In preferred forms of the invention the amorphous silicon is deposited from vapour onto the metal itself, so that there is direct and substantial contact between the silicon and the metal. For initial hydrogenation purposes, such an article can be made the cathode of an electrolysis cell. Subsequently, such an article can be used directly in a solar cell, with the metal forming an electrode of the solar cell. Chromium is a particularly suitable metal in this instance, since it bonds well to amorphous silicon on vapor deposition thereof, forms a good electrical contact with it, has a substantial capacity to absorb hydrogen, and releases hydrogen on heating to a temperature within the appropriate range. In view of the cost of chromium it will usually be preferred to provide a layer of the necessary thickness thereof, e.g. from about 1 to 50 μm mounted on a thicker self supporting material.

Other arrangements of amorphous silicon and hydrogen-carrying metal may be used, however, besides deposition of the silicon onto the metal. For example, the silicon can be adhered to the metal through the intermediary of a thin layer of a third substance. Alternatively, the amorphous silicon and hydrogen-carrying metal can be arranged in a physical supporting structure, in close proximity or contact with one another, so that the hydrogen can readily transfer from one to the other upon appropriate treatment, which will usually be heating. In a further example, the metal may be vapor deposited onto the amorphous silicon and then the so formed structure can be appropriately hydrogenated.

Whilst it is convenient to first hydrogenate the substrate metal to an appropriate hydrogen content and then vapour deposit the amorphous silicon thereon, the silicon then being hydrogenated from the hydrogen present in the substrate, if desired the hydrogenation can be conducted in the reverse order after appropriately arranging the carrier and the silicon in the required proximity.

In a specific process of the invention a layer of chromium hydride was prepared by electroplating chromium onto a stainless steel plate. Amorphous silicon was evaporated onto the chromium and the structure was maintained for two hours at about 400° C. Examination showed the the hydrogen had diffused into the silicon to about 0.5 atomic percent. Other carrier materials such as sheet plastics can be used with a substrate layer applied thereto by an suitable means; after suitable doping such a structure will comprise a relatively inexpensive solar cell of satisfactory efficiency (i.e. greater than about 5%).

We claim:

1. A method of making an amorphous-silicon-based semi-conductor device including the steps of:

(a) preparing a thicker hydrogen-containing substrate layer of a material, (b) depositing a thinner layer of amorphous silicon on the hydrogen-containing layer so that the silicon layer can receive hydrogen released therefrom, and (c) hydrogenating the said thinner layer of amorphous silicon.

2. A method as claimed in claim 1, wherein the silicon layer is hydrogenated with hydrogen obtained from the substrate layer.

3. A method as claimed in claim 2, wherein hydrogen is released from the hydrogen-containing substrate layer for hydrogenation of the silicon by heating to a temperature between about 200° and 450° C.

4. A method as claimed in claim 1, wherein the hydrogen-containing substrate layer material is a metal and is hydrogenated by electroplating it onto a further layer of a carrier material.

5. A method as claimed in claim 1, wherein the silicon is hydrogenated by electrolysis with the silicon as an electrode.

6. A method as claimed in claim 1, wherein the hydrogen-containing substrate layer material is a metal selected from the group of transition metals having incomplete electronic d-shells, and alloys thereof including a major proportion of at least one of said metals.

7. A method as claimed in claim 6, wherein the hydrogen-containing substrate layer material is a metal selected from the group titanium, vanadium, chromium, manganese, iron, cobalt and nickel, and said alloys thereof.

8. A method as claimed in claim 6, wherein the hydrogen-containing substrate layer material is a metal selected from the group chromium, iron and said alloys thereof.

9. A method as claimed in claim 1, wherein the initial hydrogen content of the hydrogen-containing substrate layer material is higher than the initial hydrogen content of the silicon and the initial hydrogen content of the silicon is in the range about 1 to about 20 atomic percent.

10. A method as claimed in claim 9, wherein the initial hydrogen content of the hydrogen-containing substrate material is in the range of about 1 to about 50 atomic percent.

11. A method as claimed in claim 1, and including the step of providing on the surfaces of the hydrogen-containing substrate material not covered by silicon a barrier material relatively impervious to hydrogen to inhibit escape of hydrogen from the hydrogen-containing substrate material except into the silicon layer.

12. A method as claimed in claim 1, and including the further step of reloading the hydrogen-containing substrate material with hydrogen.

* * * * *